United States Patent
Eppel et al.

(10) Patent No.: US 11,026,339 B2
(45) Date of Patent: Jun. 1, 2021

(54) METHOD FOR PRODUCING ELECTRONICS HOUSINGS

(71) Applicant: Robert Bosch GmbH, Stuttgart (DE)

(72) Inventors: Klaus Eppel, Lauf (DE); Michael Schermann, Appenweier (DE); Reiner Ramsayer, Rutesheim (DE); Wolfgang Glueck, Baden-Baden (DE)

(73) Assignee: Robert Bosch GmbH, Stuttgart (DE)

( * ) Notice: Subject to any disclaimer, the term of this patent is extended or adjusted under 35 U.S.C. 154(b) by 90 days.

(21) Appl. No.: 15/522,429

(22) PCT Filed: Oct. 20, 2015

(86) PCT No.: PCT/EP2015/074198
§ 371 (c)(1),
(2) Date: Apr. 27, 2017

(87) PCT Pub. No.: WO2016/066471
PCT Pub. Date: May 6, 2016

(65) Prior Publication Data
US 2017/0332503 A1    Nov. 16, 2017

(30) Foreign Application Priority Data

Oct. 29, 2014    (DE) .................... 10 2014 222 006.8

(51) Int. Cl.
*H05K 5/06* (2006.01)
*B21D 22/20* (2006.01)
(Continued)

(52) U.S. Cl.
CPC ............. *H05K 5/066* (2013.01); *B21D 22/20* (2013.01); *B23K 9/032* (2013.01); *H05K 5/0004* (2013.01);
(Continued)

(58) Field of Classification Search
CPC ........ H05K 5/066; H05K 5/0004; H05K 5/04; H05K 5/0052; B23K 9/032; B23K 2101/36; B21D 22/20
See application file for complete search history.

(56) References Cited

U.S. PATENT DOCUMENTS 3,350,535 A * 10/1967 Simon .................. B23K 9/1333
                                                            219/74
3,823,760 A *  7/1974 Bloomfield ............ B22D 18/04
                                                           164/113
(Continued)

FOREIGN PATENT DOCUMENTS

CN       102811264 A    12/2012
CN       104010456 A     8/2014
(Continued)

OTHER PUBLICATIONS

International Search Report for Application No. PCT/EP2015/074198 dated Jan. 29, 2016 (English Translation, 3 pages).
(Continued)

*Primary Examiner* — John C Hong
(74) *Attorney, Agent, or Firm* — Michael Best & Friedrich LLP (57) ABSTRACT

A method for producing a housing for electronics in which the housing is formed by a first housing element and a second housing element and in which the housing elements are composed of aluminum or an aluminum alloy. The method further includes connecting the housing elements to one another by welding so that the housing elements are held tightly together. The method also includes producing at least one of the housing elements by a die casting method in which gas that is created in the die-casting method is evacuated from the housing element by helium gas.

18 Claims, 7 Drawing Sheets

(51) Int. Cl.
    *B23K 9/032*     (2006.01)
    *H05K 5/04*     (2006.01)
    *B23K 101/36*     (2006.01)
    *H05K 5/00*     (2006.01)

(52) U.S. Cl.
    CPC ............ H05K 5/0052 (2013.01); H05K 5/04 (2013.01); *B23K 2101/36* (2018.08)

(56) References Cited

U.S. PATENT DOCUMENTS

| | | | |
|---|---|---|---|
| 4,521,668 A | 6/1985 | Osial et al. | |
| 5,344,432 A * | 9/1994 | Slettenmark | A61N 1/375 607/36 |
| 7,757,927 B2 * | 7/2010 | Bamberg | B23K 20/1205 228/112.1 |
| 2015/0013634 A1 * | 1/2015 | Schenkel | F02F 7/0039 123/195 R |

FOREIGN PATENT DOCUMENTS

| | | |
|---|---|---|
| DE | 2250780 | 5/1973 |
| DE | 102007033813 | 1/2009 |
| EP | 1765049 | 3/2007 |
| EP | 1898684 | 3/2008 |
| JP | 6064777 | 4/1985 |

OTHER PUBLICATIONS

Wei Chao Cast Forming Process. "Special Manufacturing Techniques for Liquid Rocket Engines", Oct. 1, 2014.

Gussworterbuch Dec. 31, 1986, Zhang Mingzhi, Han Binggao Vakuumguss, p. 317.

Schmelz—und Umformtechnologie von Magnesium—und Aluminiumlegierungen Mar. 31, 2012, Wu Shusen, Wan Li, An Ping Vakuumdruckguss, p. 173.

Prazise und Spezielle Bearbeitung Jul. 1, 2013, Wang Gucheng, Wang Zhenlong, Laserstrahlbearbeitung, pp. 191-193.

Worterbuch fur Hochwertige Chemische Produkte China Dec. 31, 1991, Redaktionsausschuss fur Worterbuch fur Hochwertige Chemische Produkte China Reines Argon, p. 732.

* cited by examiner

METHOD FOR PRODUCING ELECTRONICS HOUSINGS

BACKGROUND OF THE INVENTION

The invention relates to a method for producing an electronics housing of the generic type, and to an electronics housing which is produced according to the method.

A method for producing a housing for electronics, having a first housing element and a second housing element is already known. The known methods for producing a housing connect the housing elements by means of a screw connection. Sealing is performed by way of a seal which is disposed between the first and the second housing element. A multiplicity of methods steps which increase the production costs are required in production.

SUMMARY OF THE INVENTION

The weight, the installation space, the resistance to environmental influences, and the costs of the devices and/or the costs of the method for producing the device represent important factors in the development of devices, or of methods for producing devices, for application in the automotive industry. The method according to the invention, has the advantage that a fluid-tight housing which is thus resistant to environmental influences, in particular for the use in vehicles, can be produced in a simple manner. It can be considered to be a further advantage that the housing elements are readily producible from aluminum or an aluminum alloy and are light and nevertheless stable according to the requirements. Aluminum is also a material with good heat-conducting properties, on account of which a good dissipation of heat is achieved. Furthermore, a connection between the housing elements which in particular is fluid-tight can be achieved in a simple and rapid manner by means of welding according to the method according to the invention. By way of the method according to the invention a simple and cost-effective production of a light but nevertheless stable housing which is sealed in relation to fluids or environmental influences, respectively, is thus possible, in particular.

It is particularly advantageous that at least one housing element is produced by means of a forming method. Advantageously, one housing element is formed by deep drawing. The primary material for producing the housing element by means of deep drawing is a forgeable alloy that in particular is flawless and free of pores. Deep drawing according to the method allows the production of a housing element that is flawless, in particular free of pores, thin-walled, and light. It is considered to be a further advantage that deep drawing is a simple and cost-effective method for producing a housing element.

It is advantageous that the die-casting method for producing at least one of the housing elements is carried out in a gas-reduced environment. Advantageously, the interior of the casting mold, that is to say that part of the casting mold that comes into contact with the cast, is gas-reduced. It can be prevented in the case of a gas-reduced environment or casting mold that the cast which in the solidified state forms the housing element comes into contact or reacts with, respectively, gases that promote the formation of pores, gas inclusions, and/or malpositions, or said contact can be minimized.

It is furthermore particularly advantageous that the first housing element and the second housing element are produced by means of a vacuum die-casting method, a vacuum-supported die-casting method, or a Vacural casting method. Producing at least one of the housing elements by means of a vacuum die-casting method, a vacuum-supported die-casting method, or a Vacural casting method minimizes, preferably prevents, the formation of pores, gas inclusions, and/or malpositions. Producing a housing element having a minimized number of malpositions, gas inclusions, and/or pores is thus enabled.

It is furthermore advantageous that the die-casting method is carried out in a protective atmosphere, in particular of nitrogen, helium, or argon. The formation of potential malpositions, gas inclusions, or pores can be minimized by using a protective atmosphere in the die-casting method. The protective gas prevents in particular the reaction of gases with the casting material of the housing element, and thus the formation of gas inclusions, pores, or malpositions.

It is to be considered advantageous that the gases that are created in the die-casting method, such as in particular hydrogen, are evacuated, in particular exhausted, from the housing element by means of a gas, in particular nitrogen. The number of potential malformations or the creation of pores that are filled with gas, or the creation of gas inclusions, respectively, can be minimized or prevented by evacuating the gases being created. Producing a housing element for a fluid-tight housing can thus be simplified, and the quality of the housing can be improved.

One advantageous refinement lies in that the die-casting method for producing at least one housing element is carried out in a low-humidity, in particular dry, medium. Producing at least one housing element in a low-humidity environment allows in particular the establishment of a housing element having minimized malformations, gas inclusions, or pores in the housing element.

It is furthermore advantageous that the cast prior to the casting process is sufficiently de-gassed. It is thus prevented that the cast in the casting process reacts with further gases or with gases that are discharged from the cast, for example. De-gassing of the cast is advantageously performed prior to the incorporation, in particular the injection, of the cast into the die-casting mold. A reduction of the gas content in the cast piece is achieved, and kept at this level until casting takes place. On account thereof, malformations, gas inclusions, or pores can be minimized or prevented.

It is furthermore advantageous that the casting mold is temperature-controlled in an optimal manner. Premature cooling of the cast or formation of water vapor which reacts with the aluminum to form hydrogen is prevented by the optimal temperature control.

It is furthermore advantageous for the demolding agent to be minimized. The formation of a large quantity of gas by virtue of the evaporation of the demolding agent upon contract with the hot cast can be avoided by minimizing the demolding agent. It is also advantageous for the piston lubricant to be used in an optimal manner and quantity.

It is particularly advantageous that welding is performed by means of a beam welding method. Beam welding methods, in particular laser beam welding or electron beam welding, enable a high welding rate and narrow, thin, precise weld seams as well as a low thermal input and low thermal distortion of the housing elements. Any (thermal) influence pertaining to the electronics is minimized or prevented, respectively, by way of the low thermal input. The beam welding method is furthermore advantageously carried out without any additional material. Said beam welding method produces a stable and uniform connection between the two housing elements. It is to be considered a further advantage that the weld seam which has been established by means of beam welding methods is corrosion resistant. Complex geometries can also be welded by means of beam welding methods.

It is advantageous that welding is performed with a protective gas, wherein the protective gas in particular is argon, nitrogen, or helium. The protective gas during welding prevents the contact or the reaction, respectively, of the warm weld seam with a gas, in particular of the atmosphere, and most particularly water. Malpositions, gas inclusions, or pores which can render the weld seam or the housing, respectively, untight are thus minimized, in particular prevented.

It is advantageous that the electronics prior to welding, in particular beam welding, preferably laser beam welding, are disposed in one of the housing elements. Arranging the electronics prior to welding enables simple placing of the electronics in the housing.

Housing for electronics, established according to a method according to one or a plurality of the preceding method steps.

BRIEF DESCRIPTION OF THE DRAWINGS

Exemplary embodiments are illustrated in the figures and are explained in more detail in the following description. In the figures.

DETAILED DESCRIPTION

Figure 1:
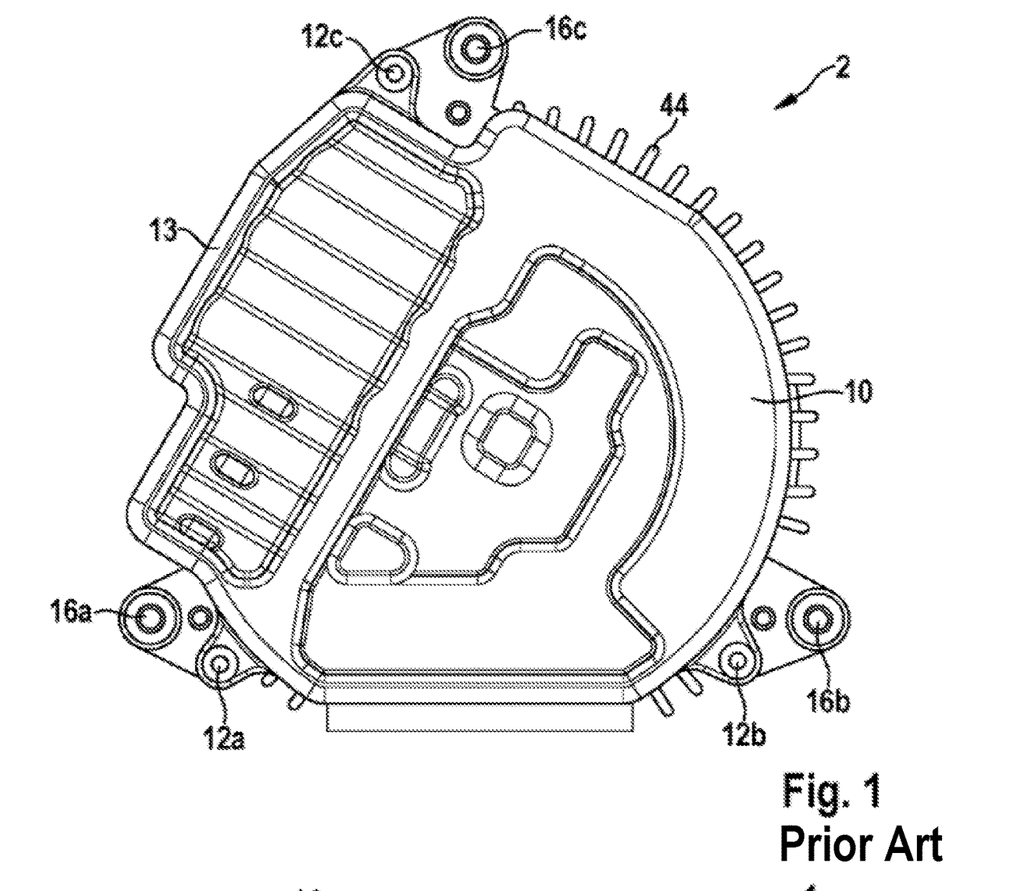
FIG. 1 shows a plan view of a housing that is produced by means of a method known in the prior art.

The plan view of a housing 2 which has been produced by means of a method known in the prior art is illustrated in FIG. 1. The housing 2 comprises a first housing element 10 and a second housing element 15. The second housing element 15 in FIG. 1 is obscured by the first housing element 10. The first housing element 10 has screw locations 12*a*, 12*b*, 12*c* or screw domes, respectively. The second housing element 15 has screw locations 17*a*, 17*b*, 17*c* which in FIG. 1 are obscured by the screw locations 12*a*, 12*b*, 12*c* of the first housing element 10. The two housing elements 10, 15 by way of screws are connected to one another by means of the screw locations 12*a*, 12*b*, 12*c*, and 17*a*, 17*b*, 17*c*.

The second housing element 15 has fastening regions, in particular three fastening regions 16*a*, 16*b*, 16*c*. The fastening regions 16*a*, 16*b*, 16*c* serve for attaching the housing 2 to a component of the vehicle, in particular for attaching to a frame.

The first housing element 10 further has a groove 13 encircling the periphery of the housing element 10. The groove 13 serves for receiving a wet seal 20. The ingress of fluids into the housing 2 is to be prevented by means of the adhesion of the wet seal 20.

Figure 2:
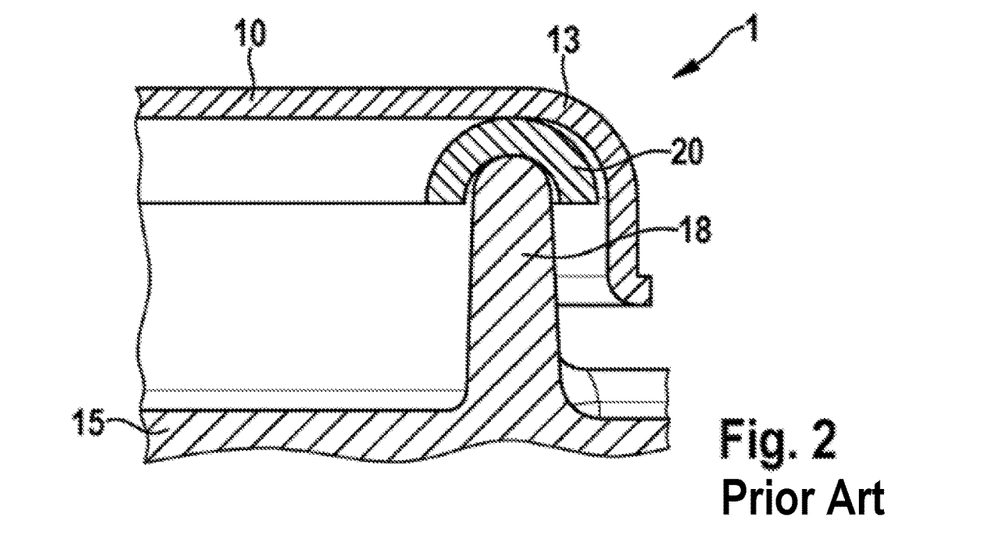
FIG. 2 shows a sectional illustration of the housing of FIG. 1.

The first housing element 10 and the second housing element 15 are shown in a sectional illustration in FIG. 2. The first housing element 10 forms a lid for the second housing element 15. The first housing element 10 has a groove 13, corresponding to that of FIG. 1. The wet seal 20 is disposed within the groove 13. The second housing element 15 has an encircling sleeve 18 that runs in the longitudinal direction. In the case of an assembled housing 2, the periphery of the sleeve 18 is disposed in the region or within the groove 13, so as to correspond to a tongue-and-groove connection, the periphery in particular engaging in the groove. The wet seal 20 is disposed between the first housing element 10 and the second housing element 15. The two housing elements 10, 15 are connected to one another by a screw connection and the screw locations 12, 17. The wet seal 20 herein is compressed. The wet seal 20 is thus intended to produce an adhesive fluid-tight connection between the first housing element 10 and the second housing element 15. The first and the second housing element 10, 15 have to be cleaned prior to the connection being produced, so as to enable adhesion of the wet seal 20. In particular, any contamination, for example by oil, or impurities in the region of the wet seal 20 lead to leakages being formed. The leakages enable fluids to ingress into the housing 2. Cleaning forms an additional operational step in the assembly, and thus causes additional costs.

Figure 3:
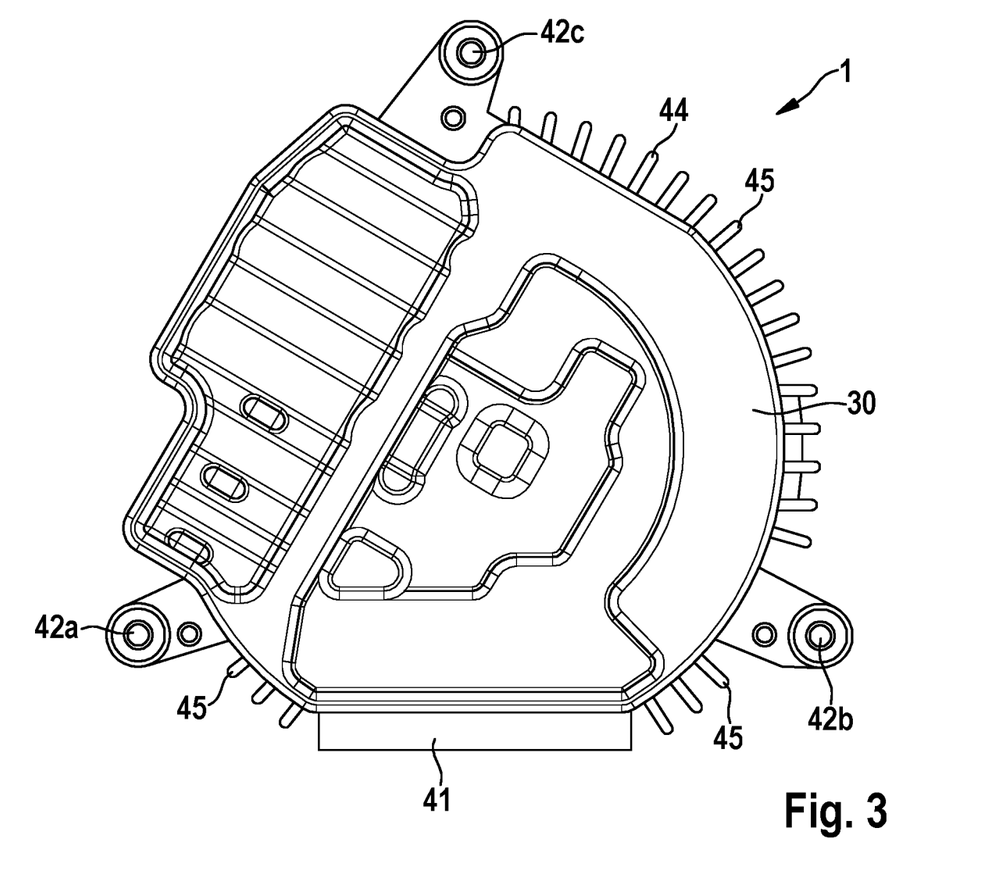
FIG. 3 shows a plan view of a housing that is produced by means of the method according to the invention.

The plan view of a housing 1 that is produced by means of the method according to the invention is illustrated in FIG. 3. The housing 1 that is produced by means of the method according to the invention has a first housing element 30 and a second housing element 40. The second housing element 40 in FIG. 3 is largely obscured by the first housing element 30. The second housing element 40 in an exemplary manner has fastening regions, in particular three fastening regions 42*a*, 42*b*, 42*c*, The fastening regions 42*a*, 42*b*, 42*c* serve for attaching the housing 1 to a component of the vehicle, in particular for attaching the electronics housing 1 to a frame.

The second housing element 40 furthermore has cooling webs 44. The heat that is created during the operation of the electronics can be dissipated by means of the cooling webs 44. The heat is transferred from the electronics to the housing 1, in particular the electronics housing 1. The heat is dissipated by means of convection from the housing 1 by way of the surface of the housing 1 and the surface of the cooling webs 44. To this end, the housing 1 is advantageously disposed in a moving air flow. The housing 1 is in particular disposed in the air flow of a fan. The fan is driven by an electric motor which is controlled by the electronics in the housing 1, for example.

As opposed to the housing 1 of FIG. 1 that is known in the prior art, the screw locations 12*a*, 12*b*, 12*c* on the first housing element 10 or 30, respectively, and the screw locations 17a, 17b, 17c on the second housing element 15 or 40, respectively, can be deleted. The complexity of the housing 1 is thus reduced, this resulting in a reduction of the production costs of the housing elements. Additional cooling webs 45 can be disposed or configured on the housing, in particular the second housing element 40, instead of the screw locations 12a, 12b, 12c, 17a, 17b, 17c. The additional cooling webs 45 have the effect of increasing the convection surface of the cooling effect of the housing 1 and thus of improved cooling of the electronics within the housing 1, in particular the electronics housing. The electronics, or the housing, respectively, can also be employed for motors having comparatively high outputs, the application spectrum thus being enlarged. The assembly is simplified too, since connecting the housing elements 30, 40 by means of screw connections is dispensed with.

Figure 4:
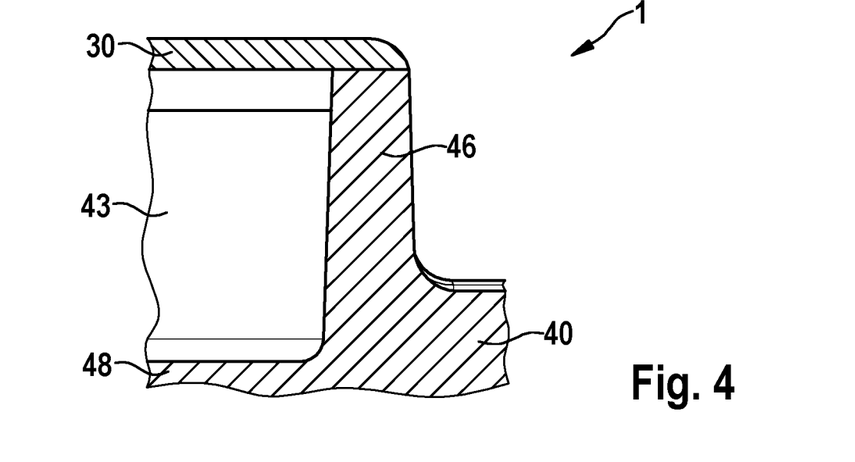
FIG. 4 shows a sectional illustration of the housing of FIG. 3, without a welded connection (prior to welding)

FIG. 4 shows a sectional illustration of the housing 1 of FIG. 3, having the first housing element 30 and the second housing element 40. The two housing elements 30, 40 are in mutual contact. In the assembly of the housing 1, the first housing element 30 is placed on top of the second housing element 40, for example.

The second housing element 40 in the longitudinal direction of the housing has an encircling portion 46, in particular a sleeve. A connector plug for actuating and/or supplying power to the electronics, or for actuating and/or supplying power to the motor is disposed on or in, respectively, a clearance 41 of the sleeve 46, for example. The second housing element 40 furthermore has a base portion 48. The base portion 48 and the sleeve 46 are configured so as to be integral. The portion 46, or the sleeve, respectively, is elevated in relation to the base portion 48 of the second housing element 40. An electronics region 43 results on account of the sleeve portion 46 that is elevated in relation to the base portion 48. The electronics are disposed in the electronics region, in particular. The second housing element 40 forms a lid for the first housing element 30. Prior to the first housing element 30 being placed on top of the second housing element 40 the electronics are disposed in the electronics region and are in particular fixed therein. According to a further embodiment, fixing of the electronics in the housing 1 is performed by way of fixing elements, in particular contact points, preferably detents on the housing elements 30, 40.

The first and the second housing element 30, 40 are disposed so as to be mutually contiguous, in particular so as to be in mutual contact. The arrangement or contact, respectively, is performed in particular by way of the sleeve 46 of the second housing element 40 and of a peripheral region of the first housing element 30. According to the invention, the first housing element 30 can likewise have a sleeve. Also, both housing elements 30, 40 can omit a sleeve in the region of the connection.

The connection of the two housing elements 30, 40 is performed by welding, in particular beam welding, preferably electron beam welding or laser beam welding. Welding produces a metallic connection, in particular a welded connection, between the two housing elements 30, 40. Good heat conductivity between the two housing elements 30, 40 and thus effective cooling of the housing 1, or of the electronics, respectively, is achieved by way of the metallic connection of the two housing elements 30, 40. By contrast thereto, the wet seal according to the prior art prevents or minimizes a formation of a thermal flow between the housing elements 30, 40. Any heat exchange performed between the housing elements 30, 40 can thus only be limited.

Beam welding connects the housing elements 30, 40 to one another by means of a metallic connection, wherein the metallic connection runs in an encircling manner, in particular. Moreover, an electrical connection that is positive for the electronics is achieved by way of the direct and encircling metallic contact between the two mating partners, or the housing elements 30, 40, respectively. EMC can be improved, for example. This is important in particular when the electronics are to be protected against electromagnetic fields or radiation of the motor, or the environment is to be protected from the electromagnetic radiation or fields of the electronics.

The installation space is furthermore optimized by the direct metallic connection between the two housing elements 30, 40. The length in the longitudinal direction, or the installation height of the housing 1, respectively, is reduced. Installation height can be saved in particular by virtue of the absence of the groove and of the wet seal.

An almost ideal draining edge and a gap-free connection also result by way of the welded connection. The impingement by corrosive media is reduced to a minimum.

Figure 5:
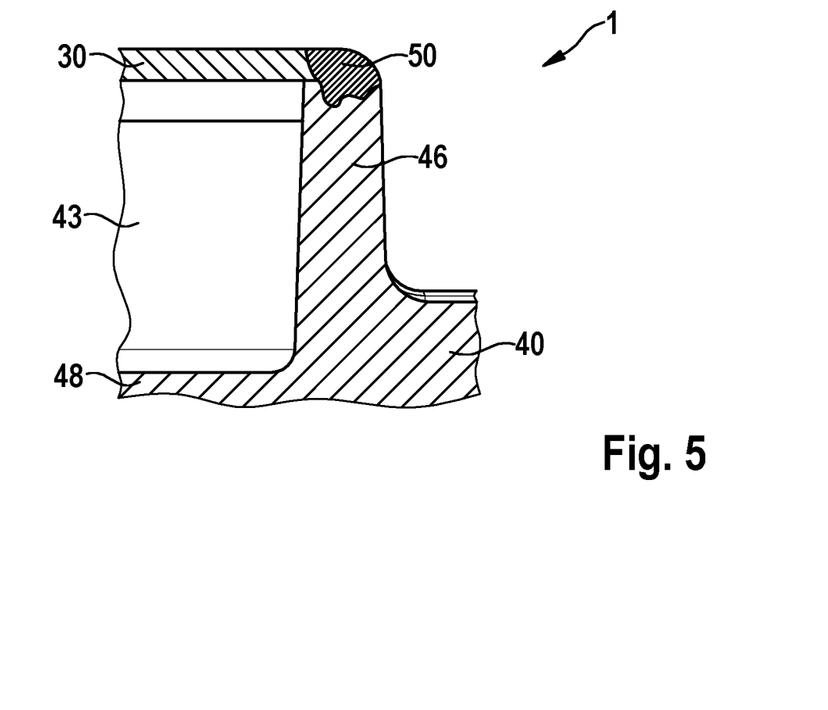
FIG. 5 shows a sectional illustration of the embodiment according to FIG. 4, having a welded connection.

FIG. 5 shows a sectional illustration of the housing 1 of FIG. 4, having the first housing element 30 and the second housing element 40, and the welded connection, in particular the weld seam. The first housing element 30 is connected to the second housing element 40 by means of welding, in particular beam welding, preferably electron beam welding or laser beam welding. The housing 1 is produced by means of the method according to the invention. According to the method, a force-fitting and/or form-fitting and a fluid-impermeable connection 50 is generated between the first housing element 30 and the second housing element 40. The weld seam 50 simultaneously forms a rounded finish of the external edge of the first housing element 30. The beam of the beam welding method impacts so as to be centric in relation to the sleeve thickness of the sleeve 46. The weld seam according to FIG. 5 is formed by combustion and fusing. The weld seam has a rounded edge. The rounding of the edge depends on the thickness of the first housing element 30 and on the position of the impact of the welding beam.

Figure 6:
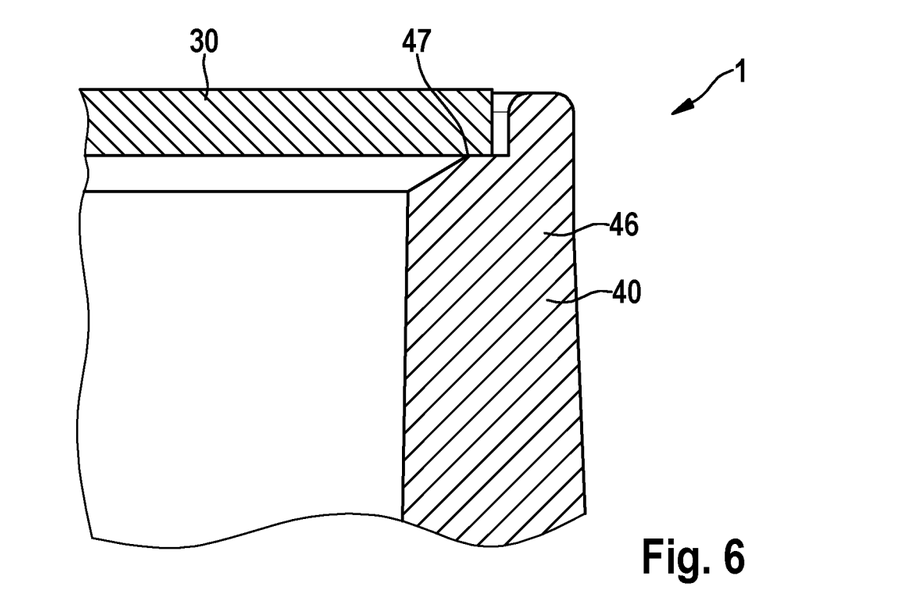
FIG. 6 shows a sectional illustration of a further exemplary embodiment of the housing, without a welded connection.

A sectional illustration of a further embodiment of the housing without a weld seam is illustrated in FIG. 6. The housing 1 has a first housing element 30 and a second housing element 40. The second housing element 40 has a sleeve 46. The sleeve 46 on that periphery of the sleeve 46 that is assigned to the first housing element 30 has an internal recess 47. The recess 47 is configured as a step in the periphery of the sleeve 46, in particular. Said recess 47 runs in an encircling manner on the inside of the sleeve 46 of the second housing element 40. The recess 47 forms a bearing face for the first housing element 30. The height level of the encircling recess 47, in particular of the step, is substantially consistent. The recess 47 is assigned to the first housing element 30. The first housing element 30 in the plan view is configured so as to be smaller than the second housing element 40. The first housing element 30 forms a lid for the second housing element 40. By contrast to a housing 1 having a wet seal 20 and a groove 13, the installation height is minimized. According to FIG. 5, the depth of the clearance in the longitudinal direction corresponds substantially to the thickness of the first housing element 30.

The first housing element 30 and the second housing element 40 can be connected to one another by means of the method according to the invention 1. The welded connection 50, in particular the tight weld seam 50, is located between the first housing element 30 and the second housing element

Figure 7:
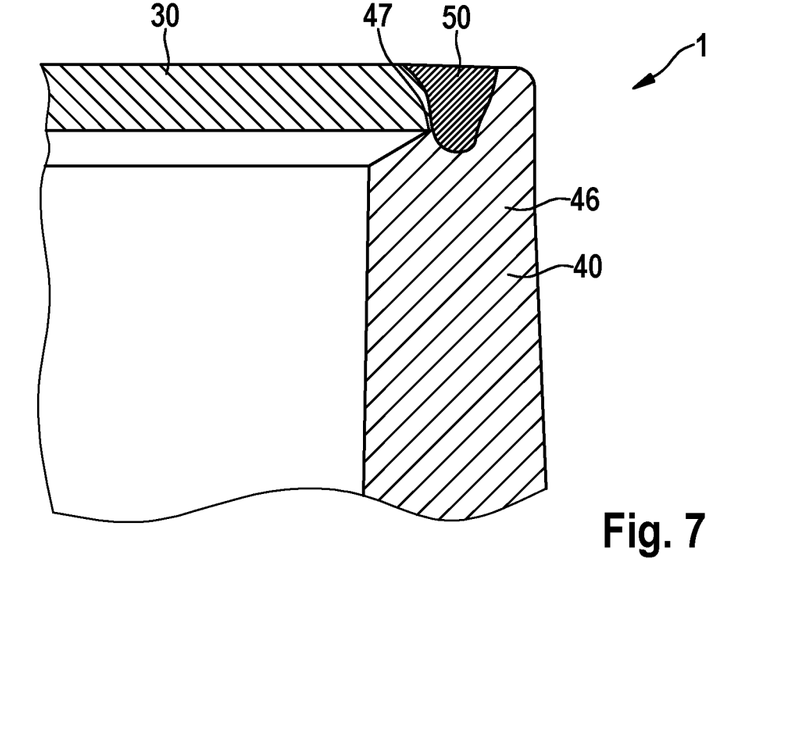
FIG. 7 shows a sectional illustration of the embodiment of the housing according to FIG. 6, having a welded connection.

40. The formation of a weld seam 50 for the metallic connection of the housing elements 30, 40 is illustrated in an exemplary manner in FIG. 7. Advantageously, not the entire material thickness of the first housing element 30 has to be welded. Thus, a comparatively low thermal input is required, on account of which heating of the electronics is likewise lower. An improved quality of the weld seam is furthermore to be expected.

Figure 8:
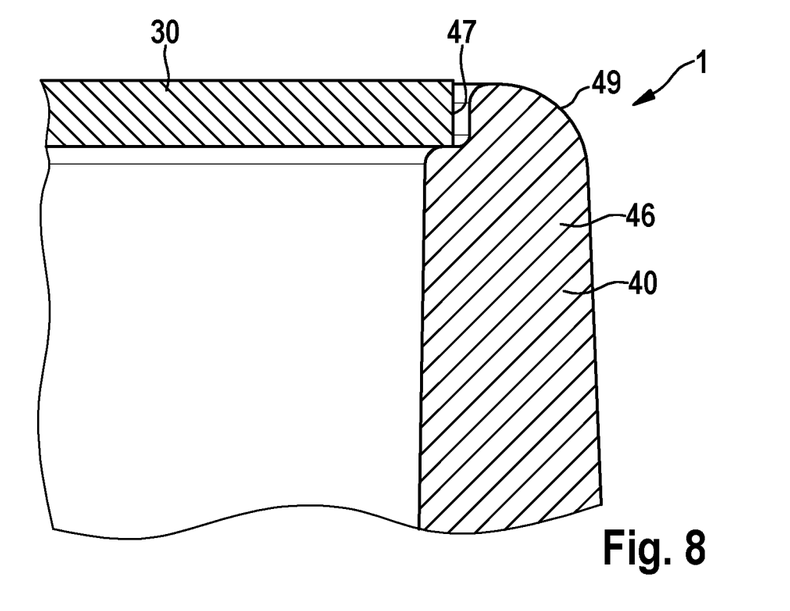
FIG. 8 shows a sectional illustration of a further exemplary embodiment of the housing, without a welded connection, and with a larger transition radius.

A sectional illustration of a further embodiment of the housing 1 is illustrated in FIG. 8. The embodiment according to FIG. 8, in a manner corresponding to the embodiments according to FIGS. 6 and 7, has a recess 47 that encircles the peripheral region of the second housing element 40. The recess 47 forms a bearing for the first housing element 30. The bearing runs on an internal side of the peripheral region of the second housing element 40. The recess 47 is advantageously configured as a step, in particular as a step of the peripheral region of the second housing element 40 that runs at a consistent height level. The recess 47, or the bearing, respectively, is assigned to or directed toward, respectively, the first housing element 30. The first housing element 30 and the second housing element 40 transition in a flush manner. The depth of the recess 47 corresponds to the thickness of the first housing element 30.

Furthermore, the peripheral region of the sleeve 46 on the outside has an enlarged rounding having a transition radius 49. The transition radius 49 results in an improved fluid routing for cooling the housing 1.

Figure 9:
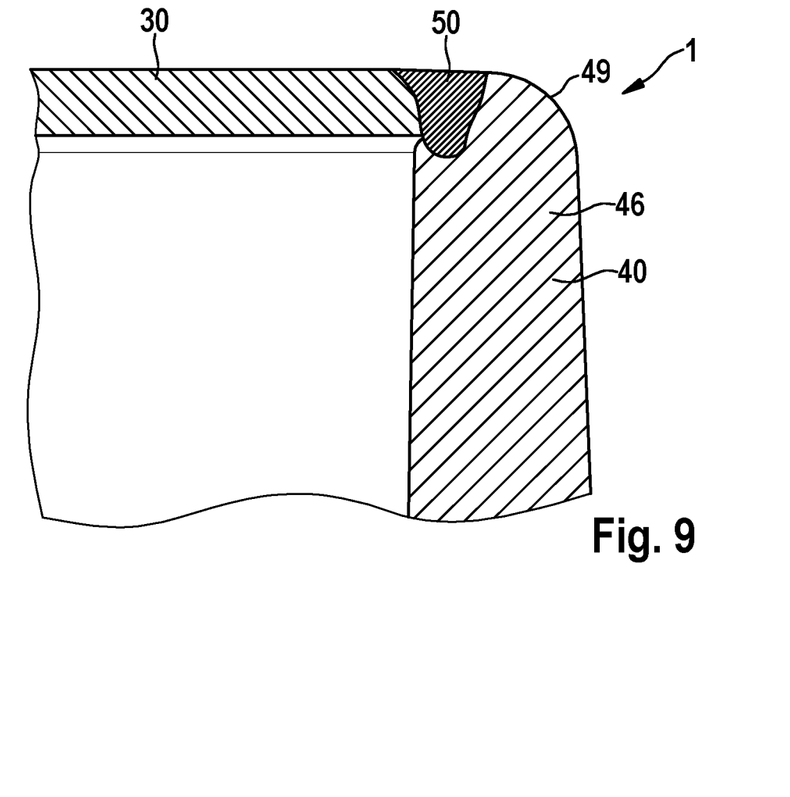
FIG. 9 shows a sectional illustration of the further embodiment of the housing according to FIG. 7, having a welded connection.

The sectional illustration according to FIG. 8 is shown having a welded connection in FIG. 9.

Figure 10:
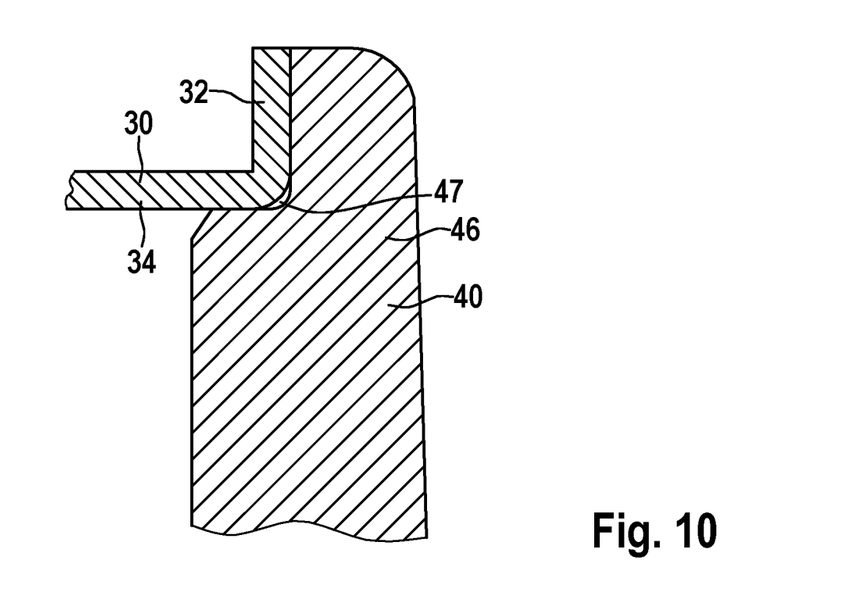
FIG. 10 shows a sectional illustration of a further exemplary embodiment of the housing, without a welded connection.
Figure 11:
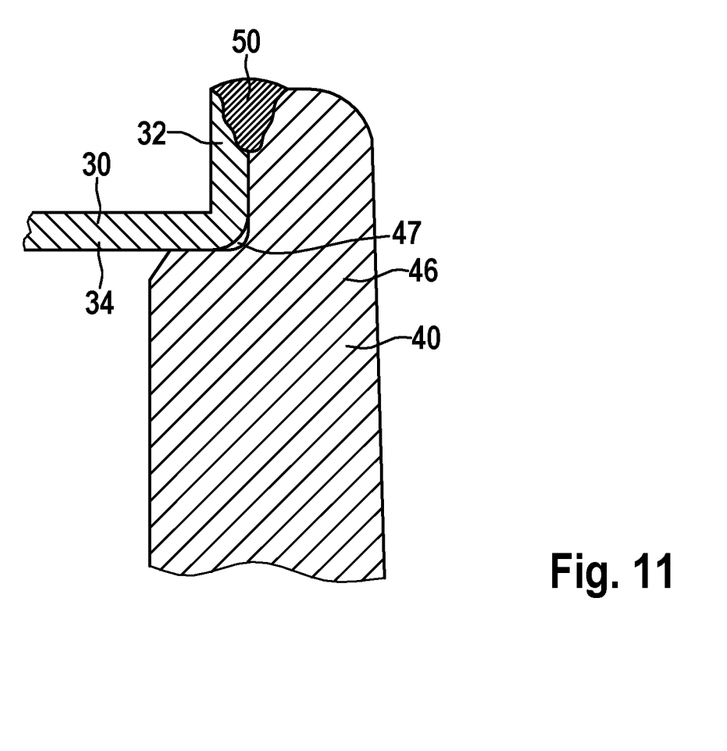
FIG. 11 shows a sectional illustration of the embodiment of the housing according to FIG. 10, having a welded connection.

A sectional illustration of a further exemplary embodiment of the housing 1 is illustrated in FIGS. 10 and 11. The first housing element 30 in the longitudinal direction has an encircling portion 32, in particular a sleeve 32. The first housing element 30 furthermore has a base portion 34. The base portion 34 of the first housing element 30 and the sleeve 32 of the first housing element 30 are configured so as to be integral. The portion 32, or the sleeve 32, respectively, is elevated in relation to the base portion 34 of the first housing element 30. The first housing element 30 forms a lid for the second housing element 40.

The second housing element 40 is configured so as to be substantially identical to that in FIG. 6, 7, 8, or 9. The first housing element 30 forms a lid for the second housing element 40. The welded connection, or the weld seam, respectively, is configured as a butt joint (I-seam).

The housing elements 30, 40 are produced by means of the die-casting method from an aluminum or an aluminum alloy. The die-casting method is a primary shaping method, that is to say that a solid body is produced from a liquid primary material, in particular a cast. To this end, alloys from aluminum having in particular a high melting point which are injected under high pressure into a dimensionally accurate re-usable mold, in particular a steel mold, so as to achieve complete filling of the casting mold, are used. The solidified cast piece assumes the details and the shape of the mold cavity of the casting mold with high precision. The advantage of die casting lies in the high degree of freedom in design. A housing element 30, 40 for a housing 1 of electronics sets high requirements in terms of heat conductivity and tightness. In particular, the die-casting method allows the configuration of cooling webs and an optimal adaptation of the geometry of the interior of the housing to the electronics located therein.

As a consequence of the methods to date for producing the housing elements 10, 15, malpositions and gas inclusions which lead to pores cannot be avoided in the housing elements 10, 15. The malpositions in downstream welding lead to untight spots which prevent complete sealing of the housing 1. In order for an ideal fluid-tight connection to be achieved between the housing elements 30, 40 it must be prevented that malpositions, pores, or gas inclusions arise.

The method according to the invention is composed of three important components: the use of suitable aluminum alloys, the correct and fault-free production of the housing elements 30, 40, and the correct connection of the housing elements 30, 40.

In the production of at least one housing element 30, 40 by a die-casting method, attention has to be paid to there being no gas inclusions, formations of faults, or pores. This can be prevented in that it is prevented in the handling of the cast that undesirable gases or humidity come into contact with the cast. The temperature of the cast should also be kept constant. The casting mold itself is temperature controlled such that evaporation of the liquids, in particular water, which accumulate in the thin-walled contours, for example, arises. The temperature of the mold is advantageously approx. 200° C. The evaporating water can additionally be suctioned from the casting mold by means of a vacuum system. The cast has to be poured into the plunger very carefully, so as to prevent excessive contact with the atmosphere. Here too, contact with humidity or with a gas having negative effects must be prevented. The plunger requires a lubricant. The latter should be chosen in a suitable manner for the method. The cast is pushed, in particular injected, into the casting mold by the plunger. An open jet results when the cast is injected into the molding space, this resulting in a very intense enlargement of the surface of the cast. Intense gassing from the atmosphere into the molding space can arise by way of the large surface. Gas inclusions and pores can result in a more pronounced manner therefrom.

Should the cast, or the liquid aluminum, or the liquid aluminum alloys, respectively, on the surface have contact with humidity, or water from the air, respectively, this can lead to malformations, pores, or gas inclusions. The water from the air reacts with the liquid aluminum, forming aluminum oxide and hydrogen. The hydrogen dissolves in the cast. Hydrogen is readily soluble in liquid aluminum. The solubility of the hydrogen decreases rapidly as the aluminum cast solidifies, and pores that are filled with hydrogen are created in the microstructure.

Figure 12:
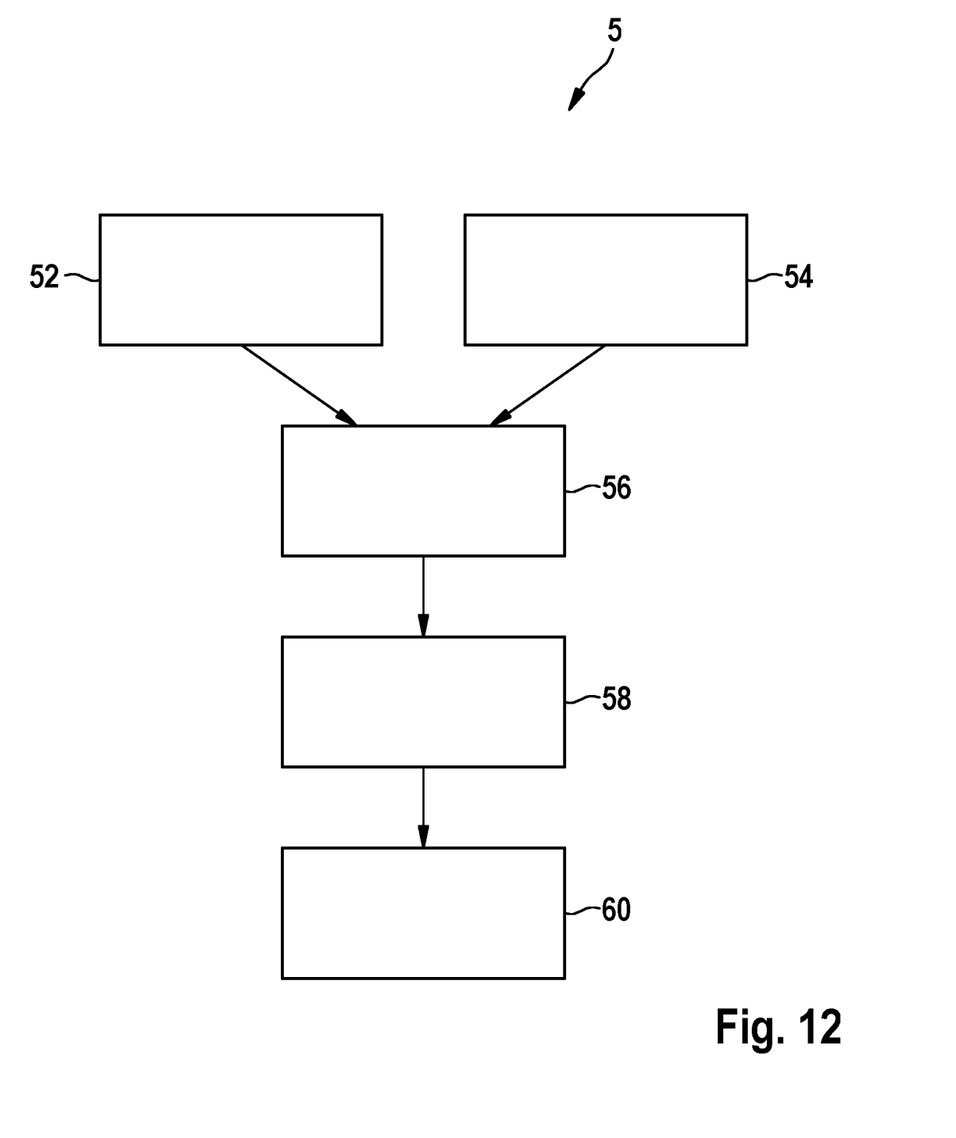
FIG. 12 shows a sequence diagram of the method according to the invention.

The method 5 is illustrated in FIG. 12. At least one of the housing elements 30, 40 is produced by means of a die-casting method in step 52. The housing element 30, 40 is composed of aluminum, in particular an aluminum alloy. According to the invention, the housing element 30, 40 is produced by means of a die-casting method, in particular the vacuum die-casting method, or a vacuum-supported die casting method, in particular a Vacural casting method. Gases and/or the air from the molding space of the casting mold are evacuated herein during the casting procedure. The casting material, or the aluminum or the aluminum alloy, respectively, thus does not come into contact with water from the air or gases.

According to a further embodiment, the casting method is carried out in a protective atmosphere. The protective atmosphere is formed by nitrogen, helium, or argon, in particular. A gas can also be blown into the casting mold. The gas blown in displaces the air or the hydrogen being created, on account of which the latter cannot react with the aluminum.

According to a further embodiment, the production of the housing element 30, 40 is carried out in a dry environment, for example in de-humidified air, on account of which the casting material or the cast, respectively, cannot come into contact with water. Hydrogen which leads to gas inclusions, pores, or malpositions in the microstructure can thus not be formed.

According to the invention, the individual embodiments can be combined with one another in an arbitrary manner.

The second housing element 40 which in terms of geometry is more complex is advantageously produced as a die-cast element.

A housing element 30, 40 is established from a forgeable alloy in step 54. Forgeable alloys are cast under ideal solidification conditions in the smelter into slabs and subsequently rolled into sheets. The peripheries in which contaminants are still located are removed herein prior to rolling. Sheets of forgeable alloys are thus free of malpositions, gas inclusions, pores, and inhomogeneity.

The housing elements 30, 40 from forgeable alloys are formed by forming, in particular a sheet-metal forming method, preferably deep drawing. No modification of the state of the material arises while the sheet is formed into the housing element 30, 40. The flawless state of the material that is achieved after rolling thus is also preserved in the housing element 30, 40. Deep drawing is performed in particular by means of forming tools such as a drawing die, a ram, and/or a sheet holder, or else by means of active media such as gases or liquids, for example hydromechanical deep drawing, or methods having high effective energy such as, for example, high-speed forming methods.

The first housing element 30 which in terms of geometry is simpler is advantageously established as a deep-drawn part from a forgeable alloy.

The electronics are disposed in one of the housing elements 30, 40 in step 56. The electronics are preferably disposed in the second housing element 40.

The first housing element 30 and the second housing element 40 are disposed so as to be mutually contiguous in step 58. The arrangement is performed according to the geometry of the housing elements 30, 40. Examples of the geometry have been previously explained by means of FIGS. 3 to 11.

The two housing elements 30, 40 are connected to one another in a fluid-tight manner in step 60. The connection is performed by means of welding. In welding, a metallic connection, in particular a welded connection, is generated between the housing elements 30, 40. The heating of the aluminum or of the aluminum alloy in welding, and the contact on the surface with humidity, for example water from the air, lead to the formation of pores, gas inclusions, and/or malpositions. The water from the air reacts with the liquid aluminum, forming aluminum oxide and hydrogen. The hydrogen dissolves in the cast. Hydrogen is readily soluble in liquid aluminum. The solubility of the hydrogen decreases rapidly as the aluminum cast solidifies, and pores that are filled with hydrogen are created in the microstructure.

In order for a fluid-tight welded connection 50, in particular the weld seam 50, to be obtained, weld seams that are in particular narrow and solidify rapidly have to be generated. In the case of narrow and rapidly solidifying weld seams there is little time for a reaction of the cast with the air, such that relatively few pores or gas inclusions are created in the weld seam. Such narrow and rapidly solidifying weld seams can be generated by means of beam welding methods, in particular laser beam welding or electron beam welding.

There is moreover the possibility for welding to be carried out under protective gas, in particular argon, nitrogen, or helium, and thus to avoid contact with the air. On account thereof, a further reduction of the pores in the weld seam is possible.

A beam welding method by way of the narrow and rapidly solidifying weld seams also enables minimal fusing of the casting material. A minimum of the pores and/or gas inclusions that are proximal to the periphery and located in the casting material are thus opened such that the number of pores in the weld seam per se is minimized and a tight weld seam is achieved.

The housing elements 30, 40 that are produced from die castings are composed of aluminum, in particular an aluminum alloy, preferably AlSi12(FE), alloy 230. The housing elements 30, 40 that are deep drawn from a forgeable alloy are composed of aluminum, in particular an aluminum alloy, preferably AlMg3 or AlSi1,2Mg0.4. It is advantageous that the copper content of the alloys is minor, in particular less than 0.3%. Other aluminum alloys can also be employed.

The housing 1 according to the invention can have an arbitrary number of housing elements 30, 40. The housing elements herein can be connected to one another in a fluid-tight manner by means of the method according to the invention.

The invention claimed is:

1. A method (5) for producing a housing (1) for electronics, wherein the housing (1) is formed by a first housing element (30) and a second housing element (40), wherein the housing elements (30, 40) are composed of aluminum or an aluminum alloy, the method comprising producing at least one of the housing elements (30,40) by a die casting method (52), and connecting the housing elements (30, 40) to one another by welding (60) so as to be tight, wherein the welding (60) is performed using nitrogen as a protective gas.

2. The method (5) for producing a housing (1) for electronics, as claimed in claim 1, characterized in that one of the housing elements (30, 40) is established by forming a forgeable alloy.

3. The method (5) for producing a housing (1) for electronics, as claimed claim 1, characterized in that the die-casting method for producing at least one of the housing elements (30, 40) is carried out in a gas-reduced environment.

4. The method (5) for producing a housing (1) for electronics, as claimed in claim 1, characterized in that the first housing element (30) and the second housing element (40) are established by a vacuum die-casting method or a vacuum-supported die-casting method.

5. The method (5) for producing a housing (1) for electronics, as claimed in claim 1, characterized in that the die-casting method is carried out in a protective atmosphere.

6. The method (5) for producing a housing (1) for electronics, as claimed in claim 1, characterized in that one of the housing elements (30, 40) is established by the die-casting method in a low-humidity atmosphere.

7. The method (5) for producing a housing (1) for electronics, as claimed in claim 1, characterized in that at least one of the housing elements (30, 40) is produced by the die-casting method from a cast that prior to being incorporated into a casting mold is de-gassed.

8. The method (5) for producing a housing (1) for electronics, as claimed in claim 1, characterized in that the welding (60) is performed as electron beam welding or as laser beam welding.

9. The method (5) for producing a housing (1) for electronics, as claimed in claim 1, characterized in that the electronics prior to welding (60) are disposed in one of the housing elements (30, 40).

10. A method (5) for producing a housing (1) for electronics, wherein the housing (1) is formed by a first housing element (30) and a second housing element (40), wherein the housing elements (30, 40) are composed of aluminum or an aluminum alloy, the method comprising producing at least one of the housing elements (30,40) by a die casting method (52), and connecting the housing elements (30, 40) to one another by welding (60) so as to be fluid-impermeable, wherein the welding (60) is performed using helium as a protective gas.

11. The method (5) for producing a housing (1) as claimed in claim 10, characterized in that one of the housing elements (30, 40) is established by deep drawing a forgeable alloy.

12. The method (5) for producing a housing (1) as claimed claim 10, characterized in that the die-casting method for producing at least one of the housing elements (30, 40) is carried out in a gas-reduced environment, wherein the interior of the a casting mold is gas-reduced.

13. The method (5) for producing a housing (1) as claimed in claim 10, characterized in that the first housing element (30) and the second housing element (40) are established by a Vacural casting method.

14. The method (5) for producing a housing (1) as claimed in claim 10, characterized in that the die-casting method is carried out in a protective atmosphere of nitrogen.

15. The method (5) for producing a housing (1) as claimed in claim 10, characterized in that one of the housing elements (30, 40) is established by the die-casting method in de-humidified air.

16. The method (5) for producing a housing (1) as claimed in claim 10, characterized in that at least one of the housing elements (30, 40) is produced by the die-casting method from a cast that prior to being incorporated into a casting mold is de-gassed.

17. The method (5) for producing a housing (1) as claimed in claim 10, characterized in that the welding (60) is performed as electron beam welding or as laser beam welding.

18. The method (5) for producing a housing (1) as claimed in claim 10, characterized in that the welding (60) is laser welding and the electronics prior to welding (60) are disposed in one of the housing elements (30, 40).

* * * * *